United States Patent [19]

Rellick

[11] Patent Number: 4,799,984

[45] Date of Patent: Jan. 24, 1989

[54] METHOD FOR FABRICATING MULTILAYER CIRCUITS

[75] Inventor: Joseph R. Rellick, Wilmington, Del.

[73] Assignee: E. I. Du Pont de Nemours and Company, Wilmington, Del.

[21] Appl. No.: 98,181

[22] Filed: Sep. 18, 1987

[51] Int. Cl.[4] .............................................. B32B 31/26
[52] U.S. Cl. ...................................... 156/89; 29/829; 29/846; 29/851; 29/852
[58] Field of Search .................... 156/89; 29/846, 829, 29/851, 852

[56] References Cited

U.S. PATENT DOCUMENTS

| | | | |
|---|---|---|---|
| 3,770,529 | 11/1973 | Anderson | 156/89 |
| 4,465,727 | 8/1984 | Fujita et al. | 156/89 |
| 4,504,339 | 3/1985 | Kamahara et al. | 156/89 |
| 4,645,552 | 2/1987 | Vitriol et al. | 156/89 |
| 4,649,125 | 3/1987 | Takeuchi et al. | 156/89 |
| 4,654,864 | 3/1987 | Steinberg | 156/89 |
| 4,655,864 | 4/1987 | Rellick | 156/89 |

*Primary Examiner*—Caleb Weston

[57] ABSTRACT

The invention is directed to a method for fabricating multilayer circuits on rigid ceramic substrates using conventional dielectric green tape and thick film conductive pastes in which the number of firing steps is substantially reduced while maintaining excellent X-Y dimensional stability.

21 Claims, 6 Drawing Sheets

(a)

(b)

(c)

(d)

(e)

(f)  Cofiring (g)

(h)  Post-firing (a)

(b)

(c)

(d)

(e)

(f)

(g) Cofiring (a)

(b)

(c)

(d)

(e)

(f)

(g)

(h) Cofiring (i)

(j) Post-firing (f) Cofiring (h) Post-firing (g) Cofiring (a)

(b)

(c)

(d)

(e)

(f)

(g)

(h) Cofiring (i)

(j) Post-firing

METHOD FOR FABRICATING MULTILAYER CIRCUITS

FIELD OF INVENTION

The invention relates to a method for fabricating multilayer circuits using dielectric green tapes to achieve electrical isolation between the layers.

BACKGROUND OF THE INVENTION

An interconnect circuit board is the physical realization of electronic circuits or subsystems from a number of extremely small circuit elements electrically and mechanically interconnected on a substrate. It is frequently desirable to combine these diverse type electronic components in an arrangement so that they can be physically isolated and mounted adjacent one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways through the dielectric called vias. Such a multilayer structure allows a circuit to be more compact.

One well known method for constructng a multilayer circuit is by sequentially printing and firing thick film conductors and insulating dielectrics on a rigid insulative substrate such as alumina. The alumina substrate provides mechanical support and also X-Y dimensional stability and facilitates registration to the patterned thick film conductors and dielectric layers. However, the thick film process has a disadvantage in that printing through a screen mesh can result in pinholes or voids in the dielectric layer which can cause shorting between conductor layers. If a thick film dielectric is formulated to allow of sufficient flow of the paste during the printing operation and thus to minimize the tendency to form pinholes, then the maintenance of small vias is likely to be compromised by the flow of dielectric paste into the via hole. Also, the repetitive printing and firing steps for each layer are time consuming and expensive.

Another prior art method for constructing multilayer circuits is that of co-firing a multiplicity of ceramic tape dielectrics on which conductors have been printed with metallized vias extending through the dielectric layers to interconnect the various conductor layers. (See Steinberg, U.S. Pat. No. 4,654,095.) These tape layers are stacked in registry and pressed together at a preselected temperature and pressure to form a monolithic structure which is fired at an elevated temperature to drive off the organic binder, sinter the conductive metal and densify the dielectric. This process has the advantage that firing need only be performed once, thus saving fabricating time and labor and limiting the diffusion of mobile metals which could cause shorting between conductors. However, this process has the disadvantage that the amount of shrinkage which occurs on firing may be difficult to control. This dimensional uncertainty is particularly undesirable in large complex circuits and can result in misregistration during subsequent assembly operations.

On the other hand, Vitriol and Brown in U.S. Pat. No. 4,645,552 disclose a process for constructing a multilayer circuit on a rigid substrate which is similar to the thick film process described above in the way that circuit layers of conductors and dielectrics are sequentially added to the circuit and fired. The circuit is fabricated on a rigid, dimensionally stable substrate by a sequence of steps such as the following:

(a) forming a conductor pattern on a dimensionally stable substrate;
(b) forming via holes in a dielectric green tape;
(c) laminating the green tape onto the substrate in registry with the conductor patterns;
(d) firing the substrate, conductor and green tape;
(e) metallizing the top surface of the dielectric tape and filling the vias; and
(f) repeating steps (b) through (e) until the multilayer structure is complete.

Such a process eliminates some of the disadvantages of the thick film multilayer circuit fabrication process because the risks of pinholes and via closure are eliminated due to the fact that green tape is used as a dielectric insulating layer and mechanically punched vias are employed. However, the process requires that a separate firing step be included for each layer of dielectic tape. This is time consuming and expensive. Furthermore, each additional firing increases the likelihood of conductor diffusion into the dielectric layers and concomitantly the risk of shorting between conductor layers.

A still further method for fabricating multilayer circuits using green tape is disclosed in Rellick, U.S. Pat. No. 4,655,864 in which firing of the functional layers is carried out sequentially, i.e., each layer is fired before application of the next layer.

SUMMARY OF THE INVENTION

The general purpose of the invention is to provide a new and improved method for fabricating multilayer circuits using conventional thick film conductive metallizations and dielectric green tapes in such manner that excellent X-Y dimensional stability of the layers is obtained during firing, with the further advantage that the layers do not have to undergo firing conditions so frequently and therefore there is less concern for the migration of conductive material into the dielectric layers. The method of the invention is therefore more economical by virtue of having fewer manipulative steps and also by producing a higher yield of reliable multilayer circuits.

The method of the invention is comprised of six basic procedures in each of which a plurality of alternating thick film conductive layers and laminated dielectric green tape layers containing vias filled with conductive metallization is co-fired. In three of these basic procedures, the methods begin by printing a patterned conductive layer onto an electrically insulative substrate. In the other three basic procedures, the methods begin by laminating a dielectric green tape onto a substrate which can be either electrically conductive or insulating.

In a first aspect, the invention is directed to a method for the fabrication of multilayer circuits comprising the sequential steps of:

(a) providing a dimensionally stable electrically insulative substrate;
(b) applying to the substrate a patterned conductive layer;
(c) laminating to the patterned conductive layer and exposed areas of the substrate a layer of dielectric green tape having vias formed therein, the vias being in registration with the patterned conductive layer of step (b);
(d) filling the vias in the laminated green tape with a conductive metallization;
(e) in the event the multilayer circuit requires more than two layers having conductive patterns, repeating the sequenece of steps (b) through (d) until the desired number of circuit layers has been obtained;
(f) co-firing the multilayer assemblage from step (e);
(g) applying a patterned conductive layer to the ceramic tape side of the co-fired assemblage from step (f) in registration with the vias in the ceramic tape; and
(h) firing the patterned conductive layer.

In a second aspect, the invention is directed to a method for the fabrication of multilayer circuits comprising the sequential steps of:
(a) providing a dimensionally stable electrically insulative substrate;
(b) applying to the substrate a patterned conductive layer;
(c) laminating to the patterned conductive layer and exposed areas of the substrate a layer of dielectric green tape having vias formed therein, the vias being in registration with the patterned conductive layer of step (b);
(d) filling the vias in the laminated green tape with a conductive metallization;
(e) applying a patterned conductive layer to the green tape side of the unfired assemblage from step (d) in registration with the vias in the green tape.
(f) in the event the multilayer circuit requires more than two layers having conductive patterns, repeating the sequence of steps (c) through (e) until the desired number of circuit layers has been obtained; and
(g) co-firing the multilayer assemblage from step (f).

In a third aspect, the invention is directed to a method for the fabrication of multilayer circuits comprising the sequential steps of:
(a) providing a dimensionally stable electrically insulative substrate;
(b) applying to the substrate a patterned conductive layer;
(c) laminating to the patterned conductive layer and exposed areas of the substrate of layer of dielectric green tape having vias formed therein, the vias being in registration with the patterned conductive layer of step (b);
(d) filling the vias in the laminated green tape with a conductive metallization;
(e) applying a patterned conductive layer to the green tape side of the unfired assemblage from step (d) in registration with the vias in the green tape;
(f) laminating to the patterned conductive layer and exposed dielectric areas a layer of dielectric green tape having vias formed therein, the vias being in registration with the patterned conductive layer of step (e);
(g) in the event the multilayer circuit requires more than three layers having conductive patterns, repeating the sequence of steps (d) through (f) until the desired number of circuit layers has been obtained;
(h) co-firing the multilayer assemblage from step (g);
(i) filling the vias in the fired ceramic tape and applying to the ceramic tape side of the fired assemblage from step (h) a patterned conductive layer in registration with the vias in the ceramic tape; and
(j) firing the multilayer assemblage from step (i).

In a fourth aspect, the invention is directed to a method for the fabrication of multilayer circuits comprising the sequential steps of
(a) providing a dimensionally stable substrate;
(b) laminating to the substrate a layer of dielectric green tape;
(c) filling any vias in the green tape and applying to the layer of dielectric green tape a patterned conductive layer;
(d) laminating to the patterned conductive layer and exposed areas of the underlying dielectric green tape a layer of dielectric green tape having vias formed therein, the vias being in registration with the patterned conductive layer of step (c);
(e) in the event the multilayer circuit requires more than two layers having conductive patterns, repeating the sequence of steps (c) and (d) until the desired number of circuit layers has been obtained;
(f) co-firing the multilayer assemblage from step (e);
(g) filling the vias in the fired ceramic tape and applying a patterned conductive layer to the ceramic tape side of the fired assemblage from step (f); and
(h) firing the vias and patterned conductive layer from step (g).

In a fifth aspect, the invention is directed to a method for the fabrication of multilayer circuits comprising the sequential steps of
(a) providing a dimensionally stable substrate;
(b) laminating to the substrate a layer of dielectric green tape;
(c) filling any vias in the green tape and applying to the layer of dielectric green tape a patterned conductive layer;
(d) laminating to the patterned conductive layer and exposed areas of the underlying dielectric green tape a layer of dielectric green tape having vias formed therein, the vias being in registration with the patterned conductive layer of step (c);
(e) filling the vias in the dielectric green tape and applying to the layer of dielectric green tape from step (d) a patterned conductive layer;
(f) in the event the multilayer circuit requires more than two layers having conductive patterns, repeating the sequence of steps (d) and (e) until the desired number of circuit layers has been obtained; and
(g) co-firing the multilayer assemblage from step (f).

In a sixth aspect, the invention is directed to a method for the fabrication of multilayer circuits comprising the sequential steps of
(a) providing a dimensionally stable substrate;
(b) laminating to the substrate a layer of dielectric green tape;
(c) filling any vias contained in the dielectric green tape layer;
(d) applying to the layer of green tape a patterned conductive layer in registry with any vias contained in the underlying dielectric green tape layer;
(e) laminating to the patterned conductive layer and exposed areas of the underlying green tape a layer of dielectric green tape having vias formed therein, the vias being in registration with the patterned conductive layer of step (d);
(f) filling the vias contained in the dielectric green tape layer applied in step (e) with a conductive metallization;
(g) in the event the multilayer circuit requires more than two layers having conductive patterns, repeating the sequence of steps (d) through (f) until the desired number of circuit layers has been obtained;

(h) co-firing the multilayer assemblage from step (g);

(i) applying a patterned conductive layer to the ceramic tape side of the cofired assemblage from step (h) in registration with the vias in the ceramic tape; and (j) firing the patterned conductive layer.

It will be recognized that in laminating green tape layers to the underlying conductive layers the green tape is also laminated to at least a selected portion of the underlying substrate or green tape layers. This is a function of specific circuit design.

BRIEF DESCRIPTION OF THE DRAWINGS

The drawings consist of six figures, FIGS. 1-6 which illustrate schematically the sequential steps of the above-described six aspects of the invention.

DETAILED DESCRIPTION OF THE INVENTION

Figure 1:
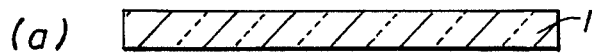
Figure 1:
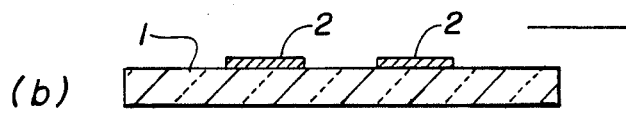
Figure 1:
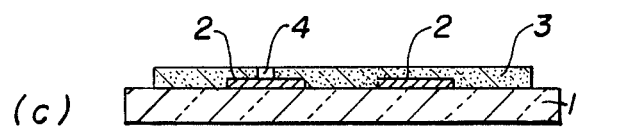
Figure 1:
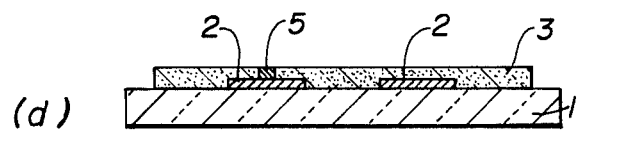
Figure 1:
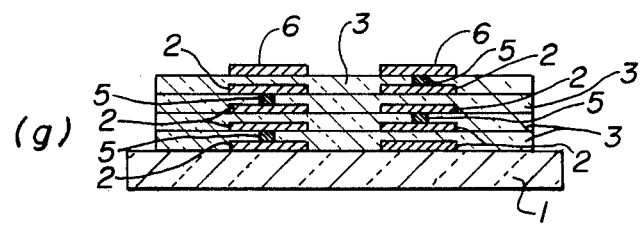

One of the many advantages of the method of the invention is that it can be carried out using conventional thick film conductive materials and dielectric green tapes as well as the conventional techniques for applying these materials to the formation of electrical circuitry.

Thus the conductive layers or metallizations can be formed from conventional thick film conductive pastes comprised of finely divided particles of conductive metal or metal oxide dispersed in an organic medium having appropriate rheology for screen printing application. Such printable thick film pastes may also contain finely divided particles of inorganic binder. After being printed in an appropriate circuit pattern, the conductive thick film layer is fired to effect volatilization of the organic medium and sintering of the solids components.

The intervening insulating (dielectric) layers are formed by laminating in registry with the underlying conductive layers one or more layers of dielectric green tape. Dielectric green tapes are comprised of finely divided dielectric materials such as barium titanate, alumina or glass dispersed in a polymeric matrix which is pyrolyzable when the laminated tape is fired in either an oxidizing or nonoxidizing atmosphere. Upon firing, the polymeric matrix is pyrolyzed (burned out) and the dielectric material is sintered and/or densified.

Such thick film conductor compositions and dielectric green tapes and the methods of applying them are well known in the electronic materials art.

Most frequently the inorganic substrates used for the invention will be electrically insulative ceramic materials such as alumina and beryllia.

A sine qua non of all substrate materials to be used in the invention is that they must be rigid when formed into thin layers (e.g., 600 microns) and they must be dimensionally stable. That is, they should not undergo any substantial degree of bowing when they are fired and, most importantly, they must posssess extreme stability in the X-Y plane. Most frequently the substrates used for the invention will be made from electrically insulative ceramic materials such as alumina. However, in some instances, substrates can be used which are made from heat-conductive metals or from ceramic-coated metals such as porcelainized steel.

Vias in the green tape layers can be filled by either two methods. In one technique the vias are filled by screen printing a thick film conductive paste directly into the vias. In another method the vias are filled during screen printing of an overlying conductive layer by flow of the thick film layer into the vias.

The method of the invention can be used to prepare multilayer circuits containing up to 10 or 12 conductive layers depending on the thickness of the green tape used. In general, the thinner the green tape, the greater the number of layers which can be reliably fabricated by the method of the invention. Green tapes will usually have thicknesses of from about 50 to 200 microns. It is preferred to use the method of the invention for making multilayer circuits having from 3 to 6 conductive layers.

DETAILED DESCRIPTION OF THE DRAWING

Referring now to FIG. 1 of the drawing, in step (a) a rigid ceramic substrate 1 made from alumina is provided. In step (b), a patterned conductive layer 2 is provided by screen printing a conductive thick film paste onto a surface of the substrate. In step (c), following application of the conductive layer 2, a layer of dielectric green tape 3 having unfilled vias 4 formed therein is laminated over the patterned conductive layer 2 and selected areas of the substrate at a temperature of 50° C. and a pressure of 600 p.s.i. for about 10 minutes. The dielectric green tape 3 is positioned so that the vias 4 are in registry with the patterned conductive layer. In step (d) the vias in the unfired tape are filled by screen printing a conductive thick film paste 5 into the vias. Following the vias filling step, the sequence of steps (b) through (d) is repeated three times so that the assemblage contains four conductive layers [step (e)]. Upon completion of the repetitive steps, the assemblage is co-fired in air by heating the assemblage to 850° C. at the rate of about 50° C. per minute and maintaining the assemblage at the 850° C. temperature for about 10 minutes after which it is cooled by discontinuing heating [step (f)]. During the co-firing step, the organic medium from the thick film paste and polymeric binder from the ceramic green tape are removed by volatilization and both the inorganic binder and alumina in the tape are sintered. A final patterned conductive layer 6 is applied to the surface of the fired ceramic tape and in registration with the filled vias therein by screen printing a thick film conductive paste thereon [step (g)]. Finally, the assemblage from step (g) is fired in the same manner as in step (f). The above-described method can be varied by firing the initial patterned conductive layer before proceeding with the initial tape lamination step. By this single firing step, the height of the initial conductive layer can be reduced, thereby facilitating conformation of the initial dielectric green tape layer with the underlying conductive layer.

In a preferred version of the method of FIG. 1 in which the multilayer structure product contains only two conductive pattern layers, the structure can be fired after step (c) as well as after steps (d) and (g).

Figure 2:
Figure 2:
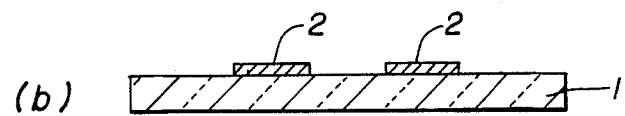
Figure 2:
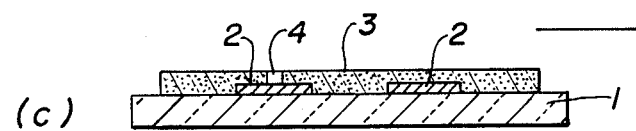
Figure 2:
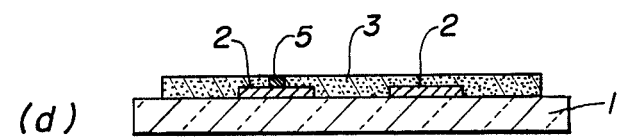
Figure 2:
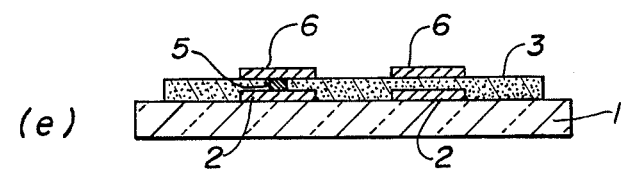
Figure 2:
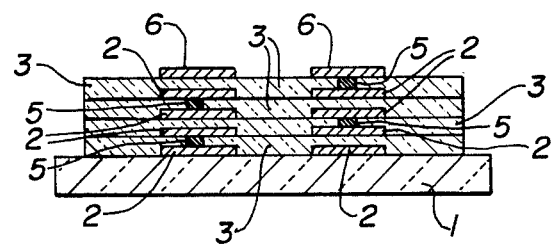

Referring to FIG. 2 of the drawing, in step (a) a rigid ceramic substrate 1 made from alumina is provided. In step (b) a patterned conductive layer 2 is applied by screen printing a conductive thick film paste onto a surface of the substrate. In step (c), following application of the conductive layer 2, a layer of dielectric green tape 3 having unfilled vias 4 formed therein is laminated over the patterned conductive layer 2 and selected areas of the substrate in registration with the underlying conductive layer 2. The laminating conditions are the same as for the procedure illustrated in FIG. 1. In step (d), the vias in the unfired ceramic green tape are filled by screen printing a conductive thick film paste 5 into the vias. In step (e), following the via filling step, a second patterned conductive layer 6 is applied in registration with the filled vias 5 in the underlying green tape layer 3 by screen printing a conductive thick film paste atop the green tape. Folowing the application of the conductive layer 6, the sequence of steps (c) through (e) is repeated three times so that the multilayer assemblage contains five conductive layers. In step (g), upon completion of the repetitive sequences, the assemblage is co-fired under the same conditions as the firing steps of the procedure illustrated in FIG. 1. The co-fired assemblage from step (f) has the same structure as the one made by the method illustrated in FIG. 1. As in the previously described method of FIG. 1, the initial conductive layer can be fired prior to lamination of the first dielectric green tape layer.

Figure 3:
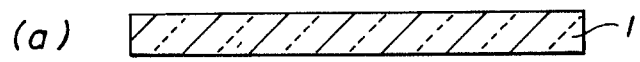
Figure 3:
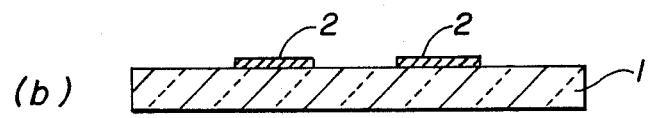
Figure 3:
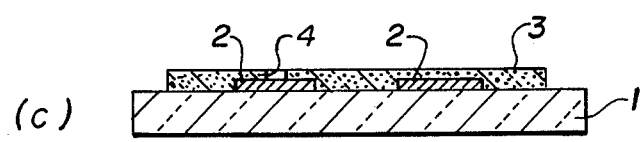
Figure 3:
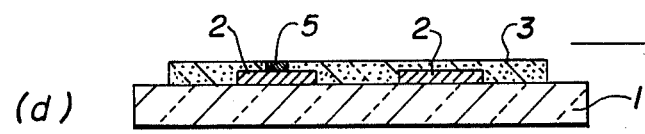
Figure 3:
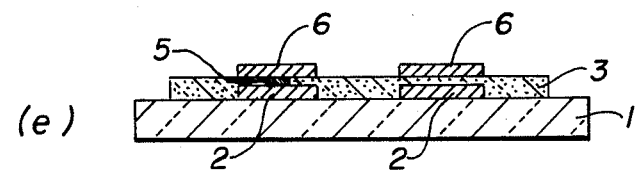
Figure 3:
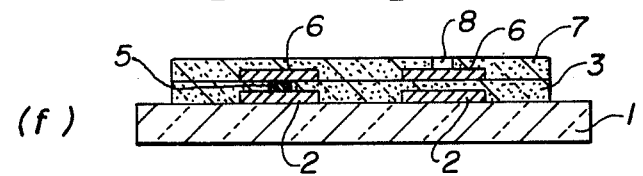
Figure 3:
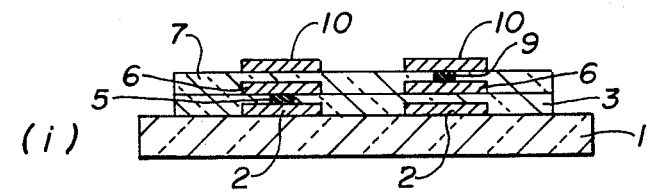

Referring to FIG. 3 of the drawings, in step (a) a rigid ceramic substrate 1 made from alumina is provided after which, in step (b), a patterned conductive layer 2 is applied by screen printing a conductive thick film paste onto the surface of the substrate 1. In step (c), after applying the conductive pattern 2, a layer of dielectric green tape 3 having unfilled vias 4 formed therein is laminated over the patterned conductive layer 2 and selected areas of the substrate in registration with the underlying conductive layer 2. In step (d), the vias 4 in the unfired ceramic green tape are filled by screen printing a conductive thick film paste into the vias. In step (e), a second patterned conductive layer 6 is applied in registration with the filled vias 5 in the underlying green tape layer 3 by screen printing. Following application of the second conductive layer 6, a second layer of dielecric green tape having unfilled vias 8 is laminated to the upper patterned conductive layer 6 and selected areas of the underlying green tape layer 3 [step (f)]. The sequence of steps (d) through (f) is then repeated two times [step (g)]after which the resulting assemblage having four conductive layers is co-fired in the above-described manner [step (h)]. After co-firing step (h), the unfilled vias 8 are filled while printing a final patterned conductive layer 10 on the surface of the final dielectric tape layer. The conductive layer is then post-fired to complete processing of the multilayer structure.

Alternatively, the filling of the vias (9) and the printing of the conductors (10) can be carried out separately. When this is done, the filled vias (9) may be fired in an additional firing step prior to applying the patterned conductor layer (10). The final multilayer structure has the same configuration as the one illustrated by FIGS. 1 and 2.

Figure 4:
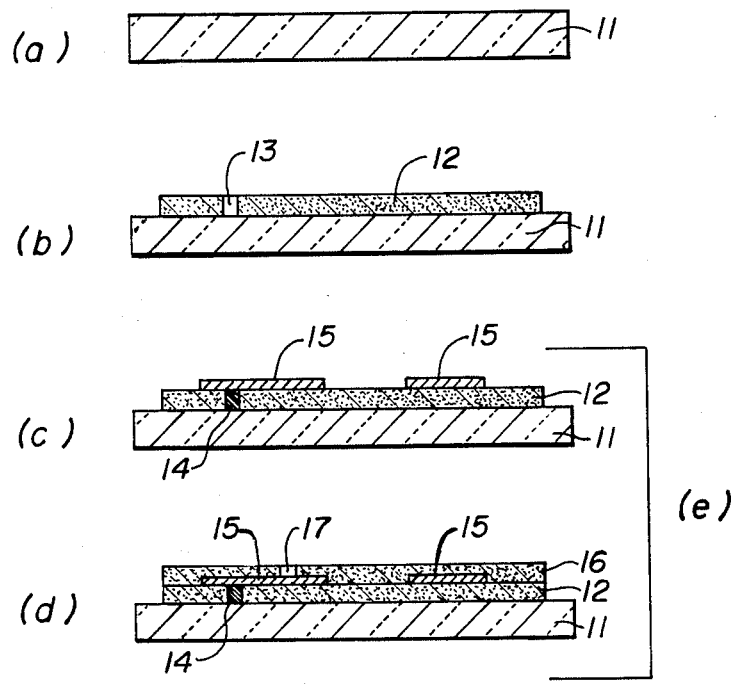
Figure 4:
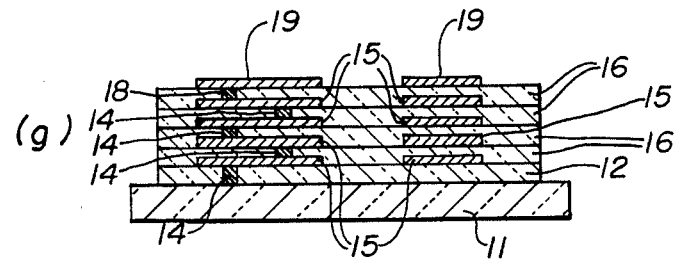

Referring to FIG. 4 of the drawings, in step (a) a rigid ceramic substrate 11 made from alumina is provided. In step (b), a layer of dielectric green tape 12 is laminated on a surface of the substrate by the procedure described in the methods illustrated by FIGS. 1 and 2. The tape layer may contain vias 13, but need not, which is a function of the circuit design. In those instances where the first tape layer does contain vias, the unfilled vias 13 may be filled during the ensuing conductive layer printing step or they can be filled by separately screen printing a conductive paste into the vias. In step (c), a patterned conductive layer 15 is applied atop the green tape layer 12 in registration with any unfilled vias 13 by screen printing. In this screen printing step, vias in the green tape are filled by flow of the thick film paste into the vias. It will, however, be recognized by those skilled in the art that the printing of the conductive layer 15 and the via fills 14 can be carried out by two separate steps as well. Upon completion of the screen printing of the thick film conductive layer and filling of the vias, if any, a second layer of dielectric green tape 16 having preformed vias therein is laminated to exposed areas of the underlying green tape layer and to the printed conductive layer 15 in registration therewith. Following application of green tape layer 16, the sequence of steps (c) and (d) is repeated three times [step (e)]so that the multilayer assemblage contains four conductive layers, after which in step (f), the assemblage is co-fired under the same conditions as the firing steps of the procedure illustrated in FIGS. 1 and 2. The unfilled vias in the top tape layer of the fired assemblage are then filled simultaneously with printing of a conductive layer 19 theron [step (g)]in the same manner as step (c). Alternatively, the printing of the conductive layer and filling the vias can be carried out separately. The assemblage from step (g) is then fired under the same conditions as the previous firing step [step (h)]. If printing of the via fill (18) is performed as a separate step from printing of the conductor (19), an additional firing step can be performed after via filling if desired. The multilayer circuit structure is illustrated in FIG. 6.

Figure 5:
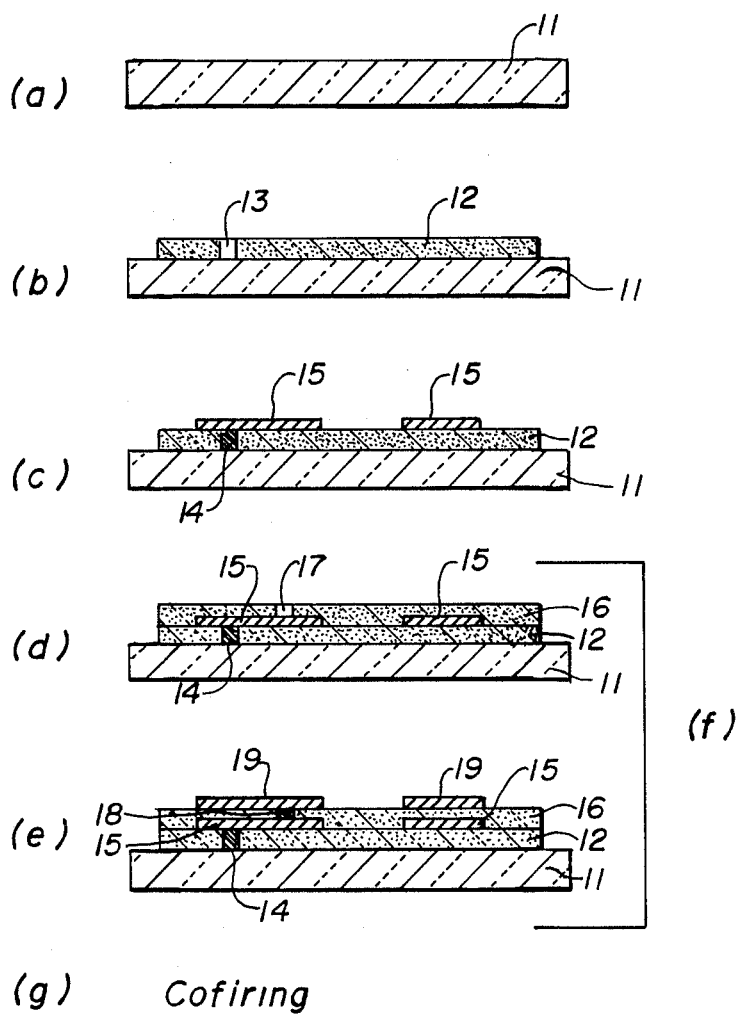
Figure 5:
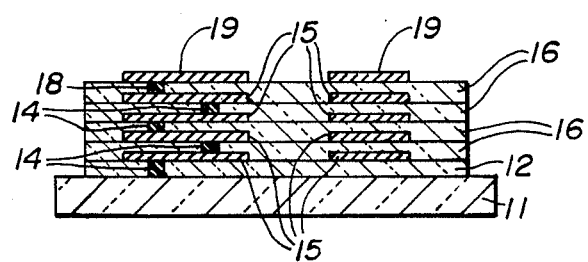

Referring to FIG. 5 of the drawing, in step (a) a rigid ceramic substrate 11 made from alumina is provided. In step (b), a layer of dielectric green tape 12 is laminated on a surface of the substrate by the procedure described in the methods illustrated by FIGS. 1 and 2. The tape layer may contain vias 13, but need not, which is a function of the circuit design. In those instances where the first tape layer does contain vias, the unfilled vias 13 may be filled during the ensuing conductive layer printing step or they can be filled by separately screen printing a conductive paste into the vias. In step (c), a patterned conductive layer 15 is applied atop the green tape layer 12 in registration with any vias 13 by screen printing. In this screen printing step, any vias in the green tape are filled by flow of the thick film paste into the vias. As describd above, the printing and via filling steps can also be carried out in separate screen printing steps. Upon completion of the screen printing of the thick film conductive layer and the via fills 14, a second layer of dielectric green tape 16 having preformed vias 17 therein is laminated to exposed areas of the underlying green tape and to the printed conductive layer 15 in registration therewith. Following application of the green tape in step (d), in step (e) a patterned conductive layer 19 is applied atop the exposed green tape layer in registration with any unfilled vias therein by screen printing thereon a conductive thick film paste. In this screen printing step, as in step (c), the vias 18 in the green tape and be filled by the flow of the thick film paste into the vias during the screen printing of the conductive layer or they can be filled by a separate screen printing step. The sequence of steps (d) and (e) is then repeated three times [step (f)]to form a multilayer assemblage having five conductive layers, after which in step (g) the assemblage is co-fired under the same conditions as described hereinabove.

Figure 6:
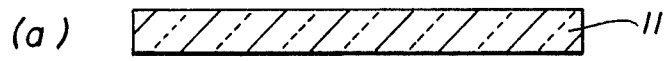
Figure 6:
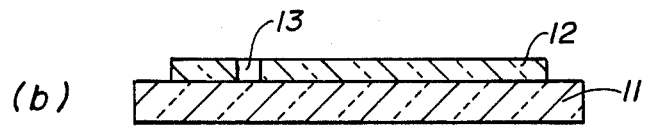
Figure 6:
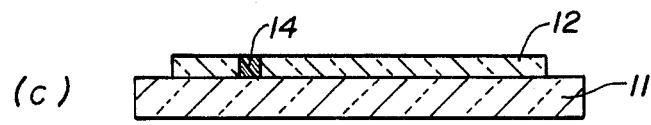
Figure 6:
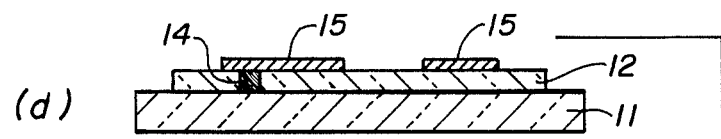
Figure 6:
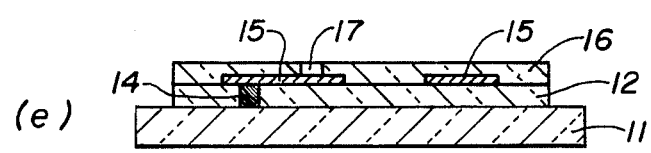
Figure 6:
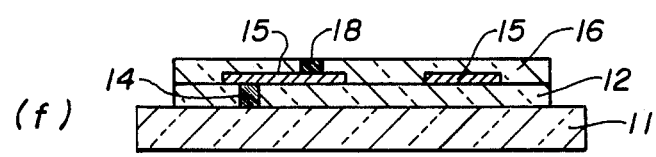
Figure 6:
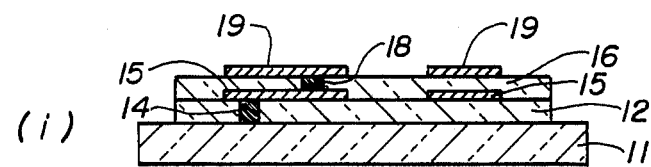

Referring to FIG. 6 of the drawings, in step (a) a rigid ceramic substrate 11 made from alumina is provided. In step (b), a layer of dielectric green tape 12 is laminated on a surface of the substrate by the procedure described in the methods illustrated by FIGS. 1 and 2. The tape layer may contain vias 13, but need not, which is a function of the circuit design. In those instances where the first tape layer does contain vias, the unfilled vias 13 may be filled during the ensuing conductive layer printing step or they can be filled by separately screen printing a conductive paste into the vias. In step (c), any unfilled vias 13 are filled by screen printing a conductive paste 14 into the vias. In step (d), a patterned conductive layer 15 is applied by screen printing over the laminated green tape 12 in registry with any filled vias 14 therein. To the conductive layer applied in step (d) and to selected portions of the exposed areas of the underlying green tape layer 12 is laminated a further layer of dielectric green tape 16 having unfilled vias 17 formed therein which are in registry with the patterned conductive layer 15. After lamination of the dielectric green tape layer 16, via fills 18 are accomplished by screen printing conductive paste therein [step (f)]. The sequence of steps (d) through (f) is then repeated three times and the multilayer structure therefrom is co-fired as described hereinabove [step (h)]. Upon completion of co-firing, a final patterned conductive layer 19 is applied to the last laminated green tape layer in registry with the filled vias [step (i)]. therein and the element is fired [step (j)].

I claim:

1. A method for the fabrication of multilayer circuits comprising the sequential steps of
   (a) providing a dimensionally stable electrically insulative substrate;
   (b) applying to the substrate a patterned conductive layer;
   (c) laminating to the patterned conductive layer and exposed areas of the substrate a layer of dielectric green tape having vias formed therein; the vias being in registration with the patterned conductive layer of step (b);
   (d) filling the vias in the laminated green tape with a conductive metallization;
   (e) in the event the multilayer circuit requires more than two layers having conductive patterns, repeating the sequence of steps (i) through (iii) until the desired number of circuit layers has been obtained:
      (i) applying a patterned conductive layer to the green tape side of the unfired assemblage from step (d) or (iii) in registration with the vias in the green tape;
      (ii) laminating to the patterned conductive layer and exposed dielectric areas a layer of dielectric green tape having vias formed therein, the vias being in registration with the patterned conductive layer of step (i);
      (iii) filling the vias in the laminated green tape with a conductive metallization;
   (f) co-firing the multilayer assemblage from step (e);
   (g) applying a patterned conductive layer to the ceramic tape side of the co-fired assemblage from step (f) in registration with the vias in the ceramic tape; and
   (h) firing the patterned conductive layer.

2. The method of claim 1 in which the initial patterned conductive layer of step (b) is fired before proceeding initialy to step (c).

3. A method for the fabrication of multilayer circuits comprising the sequential steps of:
   (a) providing a dimensionally stable electrically insulative substrate;
   (b) applying to the substrate a patterned conductive layer;
   (c) laminating to the patterned conductive layer and exposed areas of the substrate a layer of dielectric green tape having vias formed therein, the vias being in registration with the patterned conductive layer of step (b);
   (d) filling the vias in the laminated green tape with a conductive metallization;
   (e) applying a patterned conductive layer to the green tape side of the unfired assemblage from step (d) in registration with the vias in the green tape;
   (f) in the event the multilayer circuit requires more than two layers having conductive patterns, repeating the sequence of steps (i) through (iii) until the desired number of circuit layers has been obtained:
      (i) laminating to the patterned conductive layer and exposed dielectric areas a layer of dielectric green tape having vias formed therein, the vias being in registration with the patterned conductive layer of step (e) or (iii);
      (ii) filling the vias in the laminated green tape with a conductive metallization; (iii) applying a patterned conductive layer to the green tape side of the unfired assemblage from step (ii) in registration with the vias in the green tape; and
   (g) co-firing the multilayer assemblage from step (f).

4. The method of claim 3 in which the initial patterned conductive layer of step (b) is fired before proceeding initially to step (c).

5. A method for the fabrication of multilayer circuits comprising the sequential steps of
   (a) providing a dimensionally stable electrically insulative substrate;
   (b) applying to the substrate a patterned conductive layer;
   (c) laminating to the patterned conductive layer and exposed areas of the substrate a layer of dielectric green tape having vias formed therein, the vias being in registration with the patterned conductive layer of step (b);
   (d) filling the vias in the laminated green tape with a conductive metallization;
   (e) applying a patterned conductive layer to the green tape side of the unfired assemblage from step (d) in registration with the vias in the green tape;
   (f) laminating to the patterned conductive layer and exposed dielectric areas a layer of dielectric green tape having vias formed therein, the vias being in registration with the patterned conductive layer of step (e);
   (g) in the event the multilayer circuit requires more than three layers having conductive patterns, repeating the sequence of steps (d) through (f) until the desired number of circuit layers has been obtained;
   (h) co-firing the multilayer assemblage from step (g);
   (i) filling the vias in the fired ceramic tape with conductive metallization and applying to the ceramic tape side of the fired assemblage from step (h) a patterned conductive layer in registration with the vias in the ceramic tape; and
   (j) firing the multilayer assemblage from step (i).

6. The method of claim 5 in which the filled vias in step (i) are fired prior to applying the patterned conductive layer.

7. The method of claim 5 in which the vias in the fired ceramic tape are filled during application of the patterned conductive layer in step (i).

8. A method for the fabrication of multilayer circuits comprising the sequential steps of (a) providing a dimensionally stable substrate;
(b) laminating to the substrate a layer of dielectric green tape;
(c) filling any vias in the dielectric green tape with conductive metallization and applying to the layer of green tape a patterned conductive layer in registration with any vias;
(d) laminating to the patterned conductive layer and exposed areas of the underlying dielectric green tape a layer of dielectric green tape having vias formed therein, the vias being in registration with the patterned conductive layer of step (c);
(e) in the event the multilayer circuit requires more than two layers having conductive patterns, repeating the sequence of steps (c) and (d) until the desired number of circuit layers has been obtained;
(f) co-firing the multilayer assemblage from step (e);
(g) filling the vias in the fired ceramic tape with conductive metalliztion and applying to the ceramic tape side of the fired assemblage from step (f) a patterned conductive layer in registration with the vias in the ceramic tape; and
(h) firing the multilayer assemblage from step (g).

9. The method of claim 8 in which the filled vias in step (g) are fired prior to applying the patterned conductive layer.

10. The method of claim 8 in which the initial ceramic green tape contains vias which are filled during application of the initial patterned conductive layer.

11. The method of claim 8 in which the vias in the fired ceramic tape are filled during application of the patterned conductive layer in step (g).

12. The method of claim 8 in which the substrate is electrically conductive.

13. The method of claim 8 in which the substrate is electrically insulative.

14. A method for the fabrication of multilayer circuits comprising the sequential steps of:
(a) providing a dimensionally stable substrate;
(b) laminating to the substrate a layer of dielectric green tape;
(c) filling any vias in the green tape with conductive metallization and applying to the layer of dielectric green tape a patterned conductive layer;
(d) laminating to the patterned conductive layer and exposed areas of the underlying dielectric green tape a layer of dielectric green tape having vias formed therein, the vias being in registration with the patterned conductive layer of step (c);
(e) applying to the layer of dielectric green tape with conductive metallization from step (d) a patterned conductive layer and filling the vias in the dielectric green tape;
(f) in the event the multilayer circuit requires more than two layers having conductive patterns, repeating the sequence of steps (d) and (e) until the desired number of circuit layers has been obtained; and
(g) co-firing the multilayer assemblage from step (f).

15. The method of claim 14 in which the initial ceramic green tape layer contains vias which are filled during application of the initial patterned conductive layer.

16. The method of claim 14 in which the vias are filled and fired prior to application of the initial patterned conductive layer.

17. The method of claim 14 in which the substrate is electrically conductive.

18. The method of claim 14 in which the substrate is electrically insulative.

19. A method for the fabrication of multilayer circuits comprising the sequential steps of
(a) providing a dimensionally stable substrate;
(b) laminating to the substrate a layer of dielectric green tape;
(c) filling any vias contained in the dielectric green tape layer with conductive metallization;
(d) applying to the layer of green tape a patterned conductive layer in registry with any vias contained in the underlying dielectric green tape layer;
(e) laminating to the patterned conductive layer and exposed areas of the underlying green tape a layer of dielectric green tape having vias formed therein, the vias being in registration with the patterned conductive layer of step (d);
(f) filling the vias containend in the dielectric green tape layer applied in step (e) with a conductive metallization;
(g) in the event the multilayer circuit requires more than two layers having conductive patterns, repeating the sequence of steps (d) through (f) until the desired number of circuit layers has been obtained;
(h) co-firing the multilayer assemblage from step (g);
(i) applying a patterned conductive layer to the ceramic tape side of the cofired assemblage from step (h) in registration with the vias in the ceramic tape; and
(j) firing the patterned conductive layer.

20. The method of claim 19 in which the substrate is electrically conductive.

21. The method of claim 19 in which the substrate is electrically insulative.

* * * * *